United States Patent
Munakata

(10) Patent No.: US 6,905,731 B2
(45) Date of Patent: Jun. 14, 2005

(54) WAFER CONTAINER AND DUSTING PREVENTION METHOD THEREOF AND METHOD FOR CONTAINING WAFER

(75) Inventor: Hideki Munakata, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 354 days.

(21) Appl. No.: 09/926,173

(22) PCT Filed: Jan. 19, 2001

(86) PCT No.: PCT/JP01/00332

§ 371 (c)(1),
(2), (4) Date: Sep. 18, 2001

(87) PCT Pub. No.: WO01/56073

PCT Pub. Date: Aug. 2, 2001

(65) Prior Publication Data

US 2003/0019783 A1 Jan. 30, 2003

(30) Foreign Application Priority Data

Jan. 25, 2000 (JP) ........................................ 2000-016119

(51) Int. Cl.$^7$ ............................. B05D 3/00; B05D 7/02; B05D 7/22; B05D 7/24; C08J 7/04
(52) U.S. Cl. ........................ 427/354; 427/230; 427/235; 427/352; 427/353; 427/379; 427/430.1; 438/125; 206/524.3; 206/710; 206/711
(58) Field of Search ................................ 427/230, 235, 427/352, 353, 354, 372.2, 379, 384, 430.1; 438/125; 206/524.1, 524.3, 524.6, 710, 711, 525, 526, 832, 308.1

(56) References Cited

U.S. PATENT DOCUMENTS 6,158,721 A * 12/2000 Katou et al. .................. 261/26

FOREIGN PATENT DOCUMENTS

JP 09-122610 A * 5/1997
JP 10-056057 A * 2/1998

OTHER PUBLICATIONS

Abstract of Japanese Patent Publication No. 10056057A; dated Feb. 24, 1998.
Abstract of Japanese Patent Publication No. 04206548A; dated Jul. 28, 1992.
Abstract of Japanese Patent Publication No. 01199431A; dated Aug. 10, 1989.
Abstract of Japanese Patent Publication No. 06132386A; dated May 13, 1994.

* cited by examiner

Primary Examiner—Timothy Meeks
Assistant Examiner—Wesley D. Markham
(74) Attorney, Agent, or Firm—Arent Fox PLLC

(57) ABSTRACT

There are provided a dust generation preventing structure of a wafer storage case and a process for preventing dust generation thereof, wherein dust generation is effectively prevented by blocking or suppressing free movement of particles constantly generated from a surface of a wafer storage case of a synthetic resin with a coating layer of a surfactant, and a wafer storing method using the wafer storage case. The wafer storage case of synthetic resin is used for housing wafers, and a surface of the wafer storage case is coated with a coating layer of a coating agent to prevent dust generation from the surface.

8 Claims, 14 Drawing Sheets

WAFER CONTAINER AND DUSTING PREVENTION METHOD THEREOF AND METHOD FOR CONTAINING WAFER

TECHNICAL FIELD

The present invention relates to a synthetic resin wafer storage case requiring a high cleanliness level and used in storage and transportation of substrates such as semiconductor wafers, quartz glass substrates or optical discs (hereinafter may be simply referred to as "wafer"), dust generation from whose synthetic resin surface is blocked or suppressed; a process for preventing dust generation thereof, and a wafer storing method using the wafer storage case.

BACKGROUND ART

In recent years against the background of development to a large-scale integration of semiconductor integrated circuits and progress to a larger capacity of recording media, a higher cleanliness level of wafers employed for fabrication of them has been required. This is because such wafers produce causes for generation of pattern defects of semiconductor integrated circuits and recording errors of recording media only if a small number of particles exist on surfaces thereof. Therefore, while the wafers are required to be kept in a high cleanliness level, cases storing the wafers are inevitably requested to be in a high cleanliness level. When a wafer storage case storing wafers is contaminated, the wafers in the wafer storage case eventually cannot be of a high cleanliness level even if the wafers are cleaned to a high cleanliness level.

As a wafer storage case, for example, there has been known such construction as shown in FIGS. 9 to 11. In the figures, a wafer storage case 12 is constituted of a case body 14 housing wafers; and a lid 16 closing an upper opening section of the case body 14. There is mounted in the case body 14 a substrate-housing cassette 18 in which many wafers W are housed, as shown in FIG. 11. Note that a reference numeral 20 is a packing to be mounted along a peripheral portion of the upper opening section of the case body 14 and a reference numeral 22 is a substrate retainer mounted on the upper portion of the substrate-housing cassette 18.

Synthetic resins such as polypropylene and polycarbonate are generally used as materials of a wafer storage case from the viewpoint of preventing contamination by dust particles and chemicals, convenience of handling and cost. The wafer storage case is subjected to cleaning for acquiring a high cleanliness level. There are conventionally known various kinds of cleaning methods for the purpose and among them, wet cleaning is generally employed; to be detailed, there can be named ultrasonic cleaning with ultrasonic waves, shower cleaning using a high water pressure, brush cleaning in which a case is rubbed with a brush and other cleaning methods.

In various ways of semiconductor cleaning such as cleaning of the case and a wafer itself, there is used pure water or ultrapure water of specific resistance (or resistivity) of 10 MΩ·cm or higher which is obtained by removing fine particles, organic materials, dissolved gases in water such as dissolved oxygen and carbon dioxide gas, inorganic ions and others. Especially, a quality level of pure or ultrapure water used in fabrication of a semiconductor device has become further higher with increase in integration thereof and is currently almost close to the theoretical pure water value of 18.24 MΩ·cm, where no impurity is contained. In an ordinary wafer fabrication process, pure or ultrapure water of about 16 MΩ·cm or higher is used in cleaning not only wafers but also storage cases and others in which a high cleanliness level is required.

There are used as cleaning liquids, not to speak of a pure water, a surfactant, an organic solvent, acid and others, and cleaning of a synthetic resin storage case has been performed in combination of the cleaning liquids and the above-described cleaning methods. A cleaning method using a surfactant, which is typical of a cleaning method for a wafer storage case 12, is performed, as shown in FIG. 12, in a procedure of surfactant cleaning (a)→pure water cleaning (with water subjected to ion exchange treatment) (b)→pure water cleaning (with ultrapure water) (c)→a clean oven drying (d).

Along with more vigorous requirements for a cleanliness level of a wafer in recent years, requirements for a cleanliness level of a storage case for storing and transporting wafers have also become severer and the above-mentioned prior art cleaning methods have been approaching their limits in cleaning capability. That is, even if a storage case is cleaned by means of the cleaning methods using ultrapure cleaning liquid, there has arisen a problem that particles increase on wafers housed in a storage case during transportation. While this would considered to be caused by dust generation from housed wafers themselves, wafers now each having ultrahigh precision are of a nature very low in dust generation from themselves but poor cleaning of a storage case and a storage case itself serve as main causes for dust generation.

The above-mentioned causes have not been made clear heretofore, but, for example, the following explanation is given: In the prior art cleaning methods, a storage case is of synthetic resin whose surface is hydrophobic and has so-called poor wettability to avoid contact with water. For this reason, even with physical energy such as ultrasonic waves applied, a physical action thereof is not sufficiently transferred to surfaces of the synthetic resin and particles thereon so that efficient particle removal cleaning is not performed presumably, thereby leading to poor cleaning by guess.

Dust generation subsequent to the cleaning is considered to be due to particles originating from fuzzes or protrusions in micrometers residing on a synthetic resin surface of a wafer storage case and the particles are released from the synthetic resin surface with the lapse of time due to vibration of the wafer storage case, rubbing of the case against wafers housed therein or the like during transportation thereof, thus released dust particles adhering to the synthetic resin surface. Furthermore, it is considered that increase in complexity of a shape of a storage case in recent years accelerates poor cleaning of the storage case and dust generation from the storage case itself (see JP-A-96-59863).

The inventor of the present invention has conducted researches on a relationship between a prior art cleaning method and dust generation from surfaces of a wafer storage case made of synthetic resin with the result that it has been found that no matter how much high purity cleaning is repeatedly applied to the wafer storage case, particles are constantly generated from the surfaces of synthetic resin since the surfaces of synthetic resin is porous as shown in FIG. 13. Description will be given of states shown schematically in FIGS. 14 (a)-(c) of a synthetic resin surface and particles in connection with particle generation (dust generation) in the case where a wafer is cleaned by means of a prior art cleaning method using a surfactant shown in FIG. 12.

Many particles P exist on a porous synthetic resin surface 12a prior to cleaning as described above (FIG. 13). When the synthetic resin surface 12a is cleaned with a surfactant (for example, 0.3% aqueous solution), the particles P are separated from the surface 12a to move into a cleaning liquid, and after the cleaning, a surfactant layer L attached to the surface 12a is formed in a state where the surfactant layer L blocks newly generated particles P on the synthetic resin surface 12a (FIGS. 12(a) and 14(a)).

Free particles P which are separated from the synthetic resin surface 12a during the cleaning, moved into the surfactant aqueous solution and floating therein are again adsorbed or adhered to a surface of the surfactant layer L. At this time, while particles P originally existing on the synthetic resin surface 12a are separated by the cleaning to move into the cleaning liquid, since new particles are generated in the vicinity of the synthetic resin surface 12a or from the interior thereof in a porous state, particles P still exist on the synthetic resin surface 12a as shown in the schematic figure (FIG. 14(a)). The particles from the interior in the porous state are considered to cause new dust generation from a storage case itself due to poor cleaning and vibration.

When the synthetic resin surface 12a cleaned with the surfactant is further cleaned with pure water, the surfactant layer L formed on the synthetic resin layer 12a is washed; therefore, the particles P on the surfactant layer L are washed away, and the surfactant layer L is also partly washed away to partly remain on the synthetic resin surface 12a (FIGS. 12(b) and 14(b)). At this time, since the surfactant layer L is washed away to expose a bare surface 12a, the particles P blocked by the surfactant layer L is separated from the exposed surface 12a during the cleaning to move into the pure water cleaning liquid. Also, new particles P are generated on the bare surface 12a from which particles have been separated so that the particles P exist on the synthetic resin surface 12a in a similar manner as shown in the schematic figure (FIG. 14(b)).

When the cleaning with pure water is repeated, the surfactant layer L partly left on the synthetic resin surface 12a is further washed away by pure water; therefore, the surfactant layer L remains in a further shrunken state on the synthetic resin surface 12a (FIGS. 12(c) and 14(c)). At this time, particles P blocked by the remaining surfactant layer L further move into the pure water cleaning liquid since the surfactant layer L is further washed away to increase a bare surface 12a. As described above, new particles P are generated on the bare surface 12a from which particles have been separated, and thus many particles P exist on the synthetic resin surface 12a in a similar manner (FIG. 14(c)).

At the last stage, the wafer storage case 12 after cleaning is dried as it is (for example, by clean oven drying) (FIGS. 12(d) and 14(d)). Therefore, many particles P exist on the synthetic resin surface 12a in an unbound state, so the particles P are separated with ease from the synthetic resin surface due to vibration and rubbing during transportation, which causes dust generation.

Thus, the inventor has confirmed that the prior art cleaning methods, as described above, which were performed for prevention of dust generation on a synthetic resin wafer storage case have almost no effect of prevention of dust generation. Taking into consideration that since such prior art dust generation preventing measures overlook constant particle generation from the synthetic resin surface, dust generation cannot be prevented no matter how highly accurately the cleaning may be performed and hence it is impossible to reach a fundamental solution, the inventor has conducted earnest researches in order to propose a perfect solution for prevention of dust generation. As a result, the inventor has completed the present invention on the basis of a reverse conception where there is not used the cleaning technique to which the prior art methods stick.

DISCLOSURE OF THE INVENTION

It is an object of the present invention to provide a structure and a process for preventing dust generation of a wafer storage case, wherein dust generation is effectively prevented by blocking or suppressing free movement of particles constantly generated from a surface of a wafer storage case of a synthetic resin with a coating layer of a surfactant, and a wafer storing method using the wafer storage case.

In order to solve the above-described problems, a wafer storage case of the present invention is a wafer storage case of synthetic resin housing wafers, wherein a surface of the wafer storage case is coated with a coating layer of a coating agent to prevent dust generation from the surface.

A first aspect of a process for preventing dust generation of a wafer storage case of the present invention comprises the steps of coating a surface of the wafer storage case of synthetic resin housing wafers with a coating agent; drying the wafer storage case coated with the coating agent; cleaning the dried wafer storage case using pure water such that a coating layer of the coating agent remains across the surface of the wafer storage case; and drying the cleaned wafer storage case, wherein dust generation from the surface of the wafer storage case is prevented by a coating layer of the coating agent.

Furthermore, a second aspect of a process for preventing dust generation of a wafer storage case of the present invention comprises the steps of coating a surface of the wafer storage case of synthetic resin housing wafers with a coating agent; cleaning the wafer storage case using pure water such that a coating layer of the coating agent remains across the surface of the wafer storage case; and drying the cleaned wafer storage case, wherein dust generation from the surface of the wafer storage case is prevented by the coating layer of the coating agent.

The pure water used in the step of cleaning with the pure water such that a coating layer of the coating agent remains across the surface of the wafer storage case is preferably pure water with a low specific resistance, for example, of 10 MΩ·cm or less. While the lower limit value of the specific resistance is not specifically defined, the value is sufficient to be on the order of 0.1 MΩ·cm. According to the second aspect of the present inventive method, in addition to that the coating agent layer can be formed more uniformly, there is an advantage that the drying step is sufficiently performed one time only, thereby enabling simplification of the process. Note that a specific resistance of ordinary pure water in on the order of 16 to 18 MΩ·cm. By dissolving carbon dioxide into the ordinary pure water, the specific resistance thereof can be reduced.

As a coating agent used in the present invention is preferably a surfactant. While there is no specific limitation on a coating method for the above-described coating agent, for example, a surfactant, it is preferable that by immersing the wafer storage case in an aqueous solution of a coating agent, for example, a surfactant, all the surface of the wafer storage case is coated with the coating agent, for example, the surfactant. In addition to the immersion, the coating can be performed by a shower method and a spray method.

A surfactant used for coating a synthetic resin surface of a wafer storage case is not specially limited as far as the surfactant can be thinly and uniformly adsorbed or attached across the synthetic resin surface, and any of anionic, nonionic and cationic surfactants may be employed. Further, there is no specific limitation on a concentration of an aqueous solution of a surfactant, but the aqueous solution may be used in surfactant concentrations of the order of 1 ppm to 10%. Note that when a thickness of a surfactant layer is too thick, the wafer storage case is cleaned such that the surfactant in excess is washed away in the pure water cleaning step.

As the wafer storage case a new one or a reused one may be used. In the case where the reused one is used, it is subjected to prior art cleaning, for example, surfactant cleaning and pure water cleaning before coating it with a coating agent, for example, a surfactant. By doing so, removal of contaminants and a certain of particles on the storage case is effected. Furthermore, there is used as a synthetic resin material constituting a wafer storage case known materials such as polypropylene, polycarbonate and others.

Main point of the first aspect of the process for preventing dust generation of a wafer storage case of the present invention is as follows: First of all, a wafer storage case is immersed in an aqueous solution of a coating agent, for example, a surfactant, adsorbed or attached with ease to a synthetic resin surface of the wafer storage case. The wafer storage case is pulled up from the aqueous solution of the coating agent, for example, the surfactant and the pulled-up wafer storage case is dried in order to cause the surfactant layer formed on the synthetic resin layer to be firmly adsorbed or attached to the synthetic resin surface.

The surface of the layer of the coating agent, for example, the surfactant coated on the synthetic resin surface is cleaned with pure water to remove particles on the surface of the coating layer, for example, the surfactant layer. The surfactant layer formed on the synthetic resin surface suppresses dust generation from the synthetic resin and the surface of the coating layer is cleaned with pure water; therefore, no particle exists on the surface of the coating layer, for example, the surfactant layer.

For this reason, in the wafer storage case whose surface is coated with the coating agent, for example, the surfactant, no dust generation occurs from the synthetic resin surface because particles on the synthetic resin surface are blocked or suppressed by the coating layer, for example, the surfactant layer, and in addition no particle exists on a surface of the coating layer, for example, the surfactant layer; therefore, no dust generation occurs from the surface of the coating layer, for example, the surfactant layer either. Accordingly, dust generation from the wafer storage case is effectively prevented.

In the second aspect of the process for preventing dust generation of a wafer storage case of the present invention, first of all, as described in the first aspect, the wafer storage case is immersed in an aqueous solution of a coating agent, for example, a surfactant adsorbed or attached with ease to a synthetic resin surface of the wafer storage case. The wafer storage case is pulled up from the aqueous solution of the coating agent, for example, the surfactant and the surface layer of the layer of the coating agent, for example, the surfactant, coated on the synthetic resin, is cleaned with pure water. The surface of the coating agent layer, for example, the surfactant layer is cleaned with pure water, and hence turns into a uniform state of no particles.

At this time, it is preferable that pure water with a low specific resistance (10 MΩ·cm or less) is used as the pure water. By using the pure water with a low specific resistance, partial separation of the coating agent, for example, the surfactant is suppressed. The layer of the surfactant is more uniformly formed than in case of cleaning with ordinary pure water, and the layer of the surfactant formed on the synthetic resin surface suppresses dust generation from the synthetic resin. In addition, since the layer of the surfactant is dried in the above mentioned state, a similar effect to the first aspect is obtained. Besides, according to the second aspect, the drying step is finished only once, so there arises an advantage of enabling simplification of the process.

A surface of a wafer storage case which is an object of coating with a coating agent, for example, a surfactant in the present invention means a surface facing a space in which wafers are housed. That is, it is not necessarily required that surfaces of all of the case (inside and outside of the case) are coated. If there is coated surfaces facing to at least an inner space of the hermetically closed case, for example, an inner surface of a case body, an inner surface of a lid, and surfaces of members inside the case such as a substrate housing cassette, a substrate retainer and others, a function and result of the present invention can be achieved. Thus, when the inner surfaces of at least the case body and the lid, and all the surfaces of members such as a substrate housing cassette, a substrate presser and others are coated with a coating agent, for example, a surfactant so that dust generation therefrom is prevented, attachment of particles and others onto the wafers can be prevented during housing, transportation and the like of the wafers.

A coating agent forming a coating layer on a surface of each of such members complicated in shape is preferably a material capable of being handled in a liquid state and coating uniformly and thinly thereon. In this regard, a surfactant is especially preferable. A surfactant does almost not generate any of dust particles, organic materials from itself, further has an antistatic property and still further can prevent second attachment of particles thereto caused by static electricity and consequently can be used as a preferred coating layer.

A first aspect of a wafer storing method of the present invention comprises the steps of: preparing wafers; and housing the wafers in a wafer storage case of the present invention.

A second aspect of a wafer storing method of the present invention comprises the steps of: preparing wafers; and housing the wafers in a wafer storage case treated by the first or second aspect of the process for preventing dust generation of the wafer storage case of the present invention.

In the wafer storing method of the present invention, as wafers to be housed in the storage case, there can be exemplified substrates, for example, semiconductor wafers such as of silicon, gallium arsenide, etc., quartz glass substrates, optical discs and others.

BEST MODE FOR CARRYING OUT THE INVENTION

Description will be given of embodiments of the present invention below on the basis of FIGS. 1 to 8 among the accompanying drawings. It is needless to say that various modifications or alterations of the embodiments can be carried out instead of the below described embodiments as far as not departing from the technical concept of the present invention. Note that cases where a surfactant is used as a coating agent are shown as preferable examples in the following description.

Figure 1:
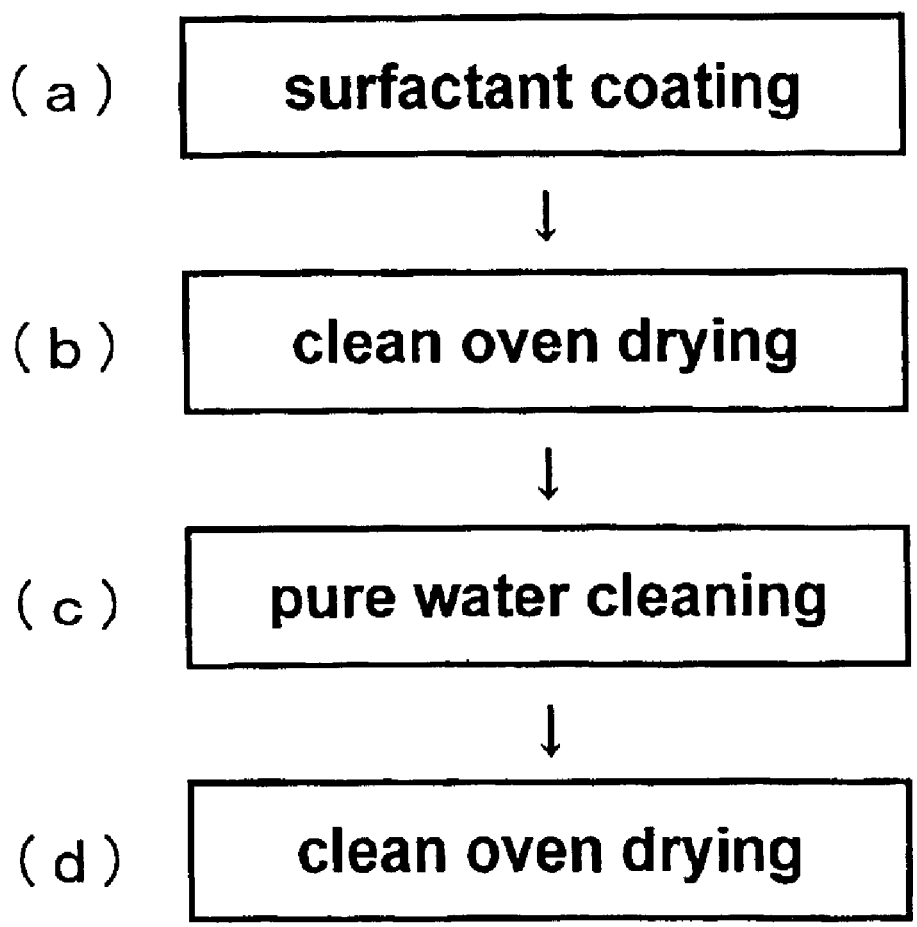
FIG. 1 is a flow chart showing steps of a first aspect of a process for preventing dust generation of a wafer storage case of the present invention.
Figure 2:
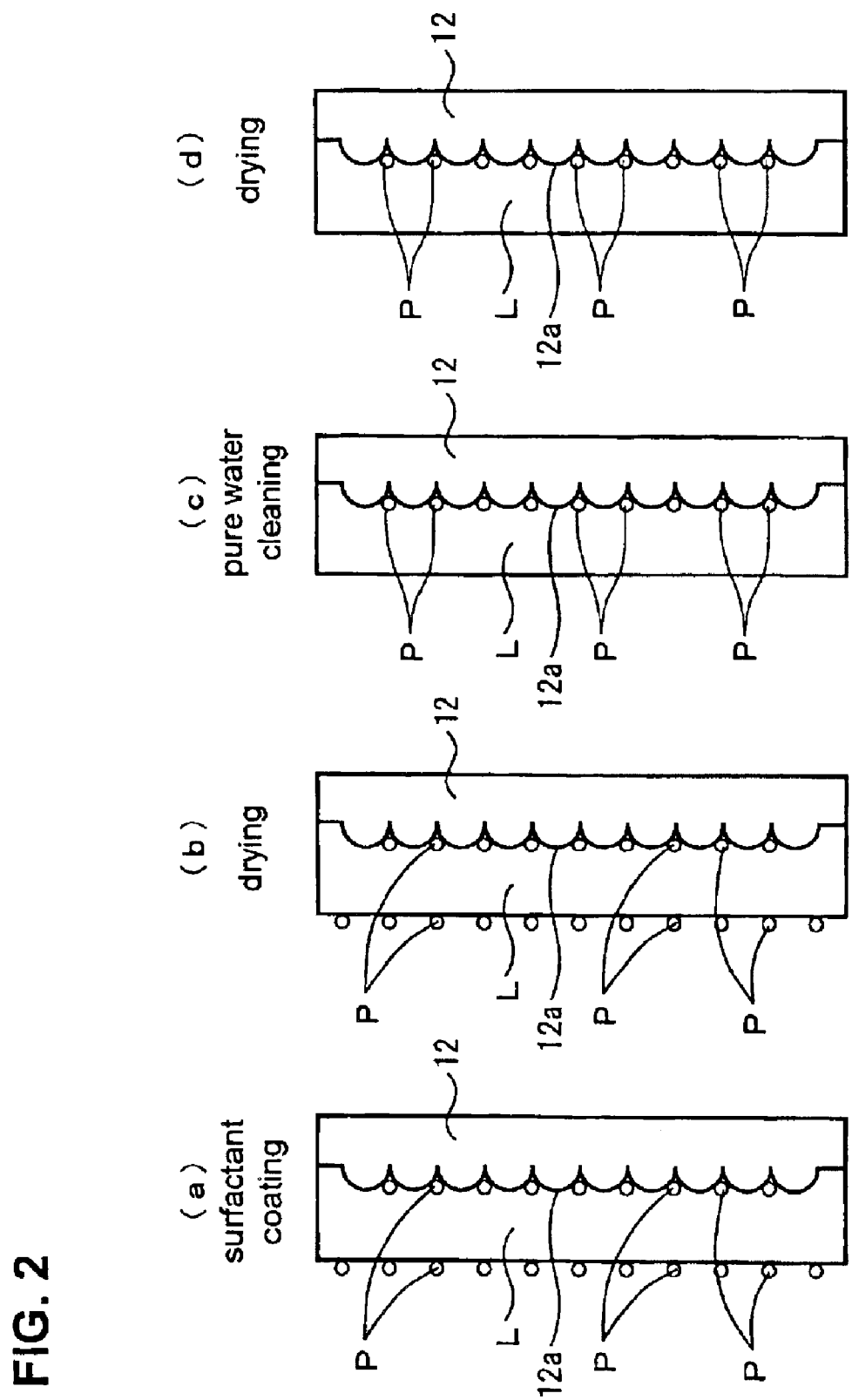
FIG. 2 is a schematic view showing states in order of steps each of a synthetic resin surface of a wafer storage case and particles thereon applied with the first aspect of a process for preventing dust generation of a wafer storage case of the present invention.

FIG. 1 is a flow chart showing steps of a first aspect of a process for preventing dust generation of a wafer storage case of the present invention, and FIG. 2 is a schematic view showing states in order of steps each of a synthetic resin surface of a wafer storage case and particles thereon applied with the first aspect of a process for preventing dust generation of a wafer storage case of the present invention.

Figure 13:
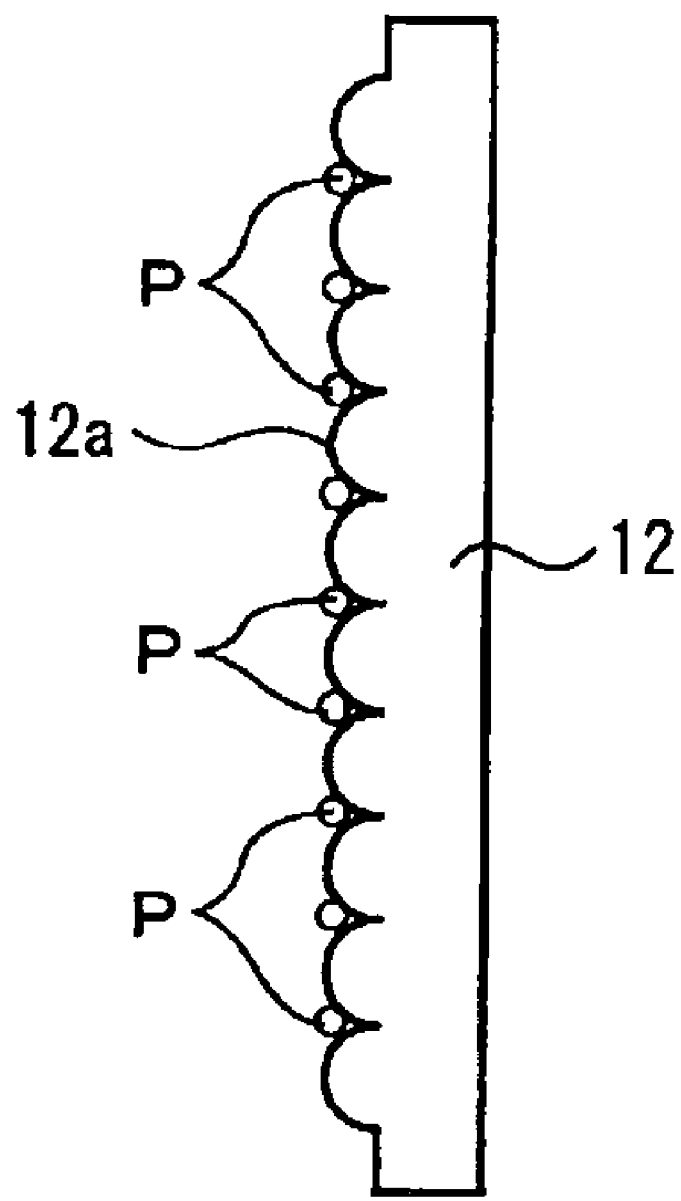
FIG. 13 is a schematic view showing a state of a synthetic resin surface of a wafer storage case and particles thereon.

The first aspect of a process for preventing dust generation of a wafer storage case of the present invention, as shown in FIG. 1, is basically performed according to a procedure of surfactant coating (a)→drying (for example, clean oven drying) (b)→pure water cleaning (c)→drying (for example, clean oven drying) (d). As described above and shown in FIG. 13, many particles P exist on a synthetic resin surface 12a of a wafer storage case 12 prior to treatment according to the first aspect of a process for preventing dust generation of a wafer storage case of the present invention. First of all, by coating the synthetic resin surface 12a with a surfactant, a surfactant layer L is formed in a state where the particles P are blocked on the synthetic resin surface 12a (FIGS. 1(a) and 2(a)). There are adsorbed or attached on a surface of the surfactant layer L free particles P which are separated from the synthetic resin surface 12a during coating and then move into the surfactant and float therein.

Figure 12:
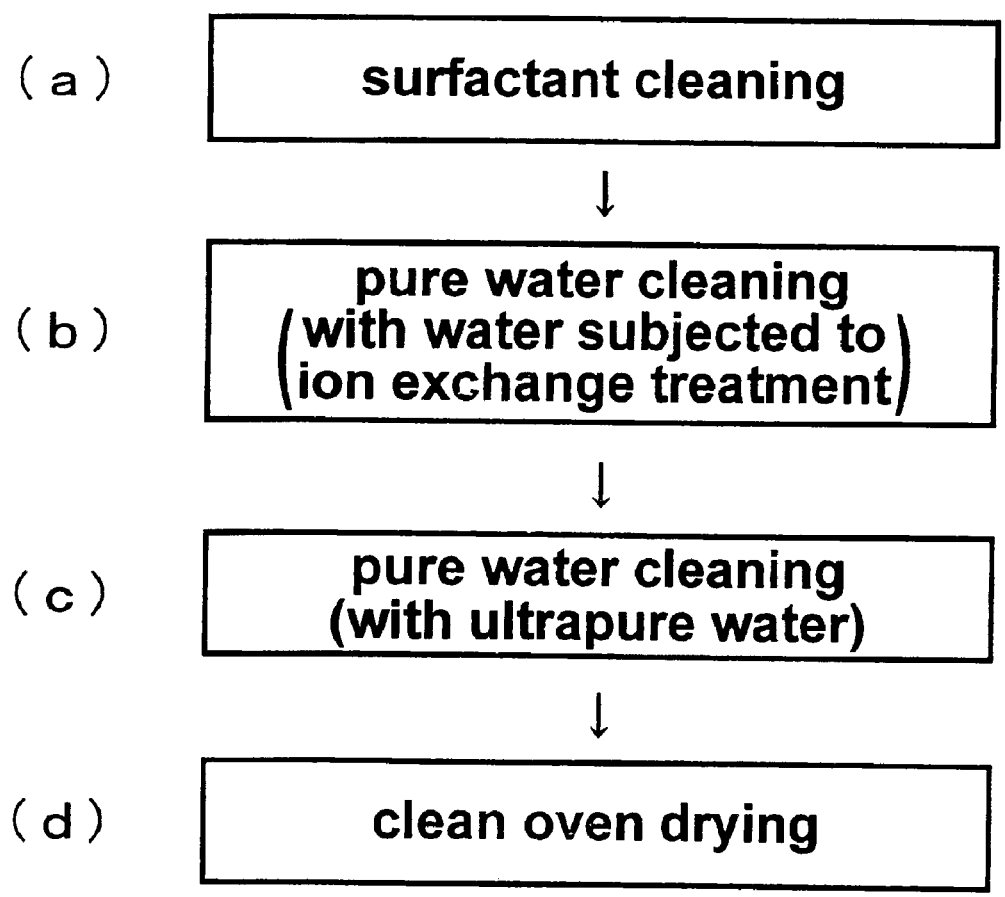
FIG. 12 is a flow chart showing steps of a prior art cleaning process for a wafer storage case.
Figure 14:
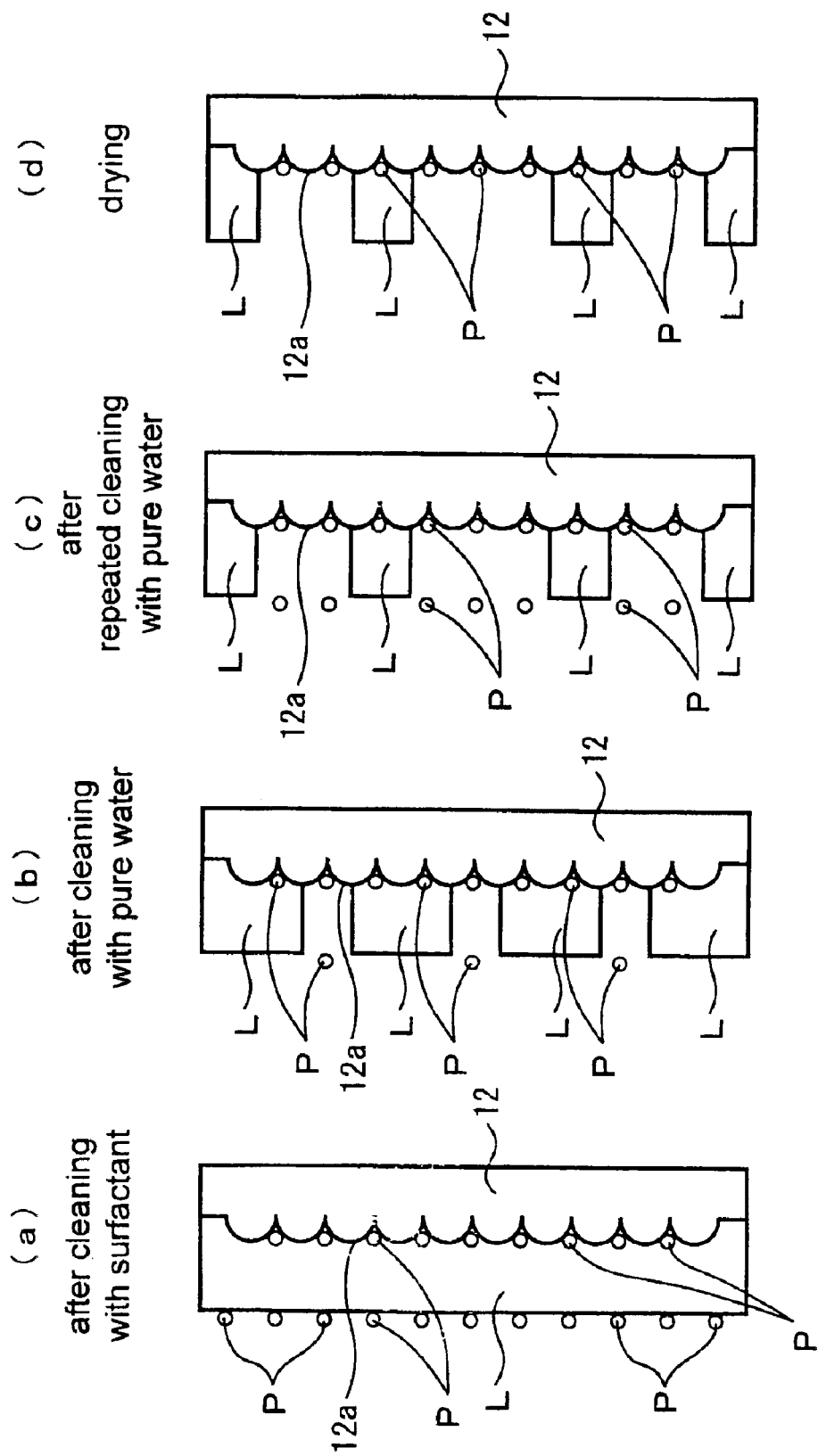
FIG. 14 is a schematic view showing states in order of steps each of a synthetic resin surface and particles thereon in the case where a wafer storage case is cleaned by means of the prior art cleaning process shown in the flow chart of FIG. 12.

It is enough for the coating treatment with a surfactant to form the surfactant layer L on the synthetic resin surface 12a, no specific limitation being required therefor. For example, the wafer storage case 12 may be immersed in an aqueous solution of the surfactant, or the surfactant cleaning of FIG. 12(a) according to the prior art process may be applied to form the surfactant layer L as shown in FIG. 14(a). At this time, as for particles P originally present on the synthetic resin surface 12a, a small amount thereof moves into the surfactant in case of simple immersion of the wafer storage case 12, and a large amount thereof moves into the surfactant in case of cleaning thereof. However, since new particles P are generated on the synthetic resin surface 12a, many particles P are present on the synthetic resin surface 12a as is similar to prior to the treatment shown in FIG. 13 (FIG. 2(a)).

Then, the synthetic resin surface 12a after coating treatment with the surfactant is dried (for example, by clean oven drying) as it is (FIG. 1(b)). By the drying, the surfactant layer L exists, particles P attach on a surface of the surfactant layer L and particles P present on the synthetic resin surface 12a are blocked and suppressed by the surfactant layer L (FIG. 2(b)).

Subsequently, the synthetic resin surface 12a on which the dried surfactant layer L has been already formed is cleaned with pure water (FIG. 1(c)). By this pure water cleaning, the particles P attached on the surface of the dried surfactant layer L are washed away (FIG. 2(c)). At this time, it is important to perform the cleaning so as to maintain a state where the surfactant layer L covers all of the synthetic resin surface 12a. If the surfactant layer is partly lost, a bare portion of the synthetic resin surface 12a is exposed, so effective prevention of dust generation cannot be carried out. Therefore, it is necessary to perform pure water cleaning with care not to cause partial loss of the surfactant layer L.

Finally, the wafer storage case 12 after pure water cleaning is again dried (for example, by clean oven drying) (FIGS. 1(d) and 2(d)). Therefore, although many particles P exist on the synthetic resin surface 12a, all the particles P are blocked and suppressed by the surfactant layer L, so the particles P do not separate from the synthetic resin surface 12a even if forces such as vibration and rubbing are applied to the wafer storage case 12 during transportation or the like, thereby dust generation being effectively prevented.

In the embodiment of the first aspect of a process for preventing dust generation of a wafer storage case of the present invention shown in FIGS. 1 and 2, while description is given of the case where after the coating treatment with a surfactant, the synthetic resin surface 12a is dried as it is, the drying treatment (FIGS. 1(b) and 2(b)) may be omitted, which case will be described on the basis of FIGS. 3 and 4.

Figure 3:
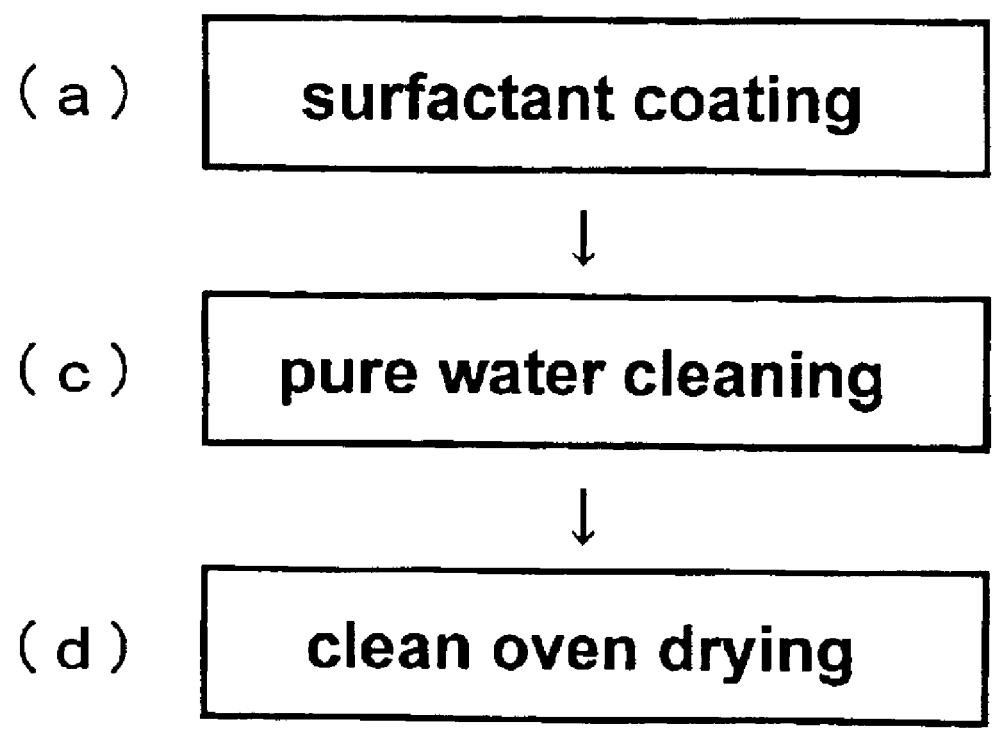
FIG. 3 is a flow chart showing steps of a second aspect of a process for preventing dust generation of a wafer storage case of the present invention.
Figure 4:
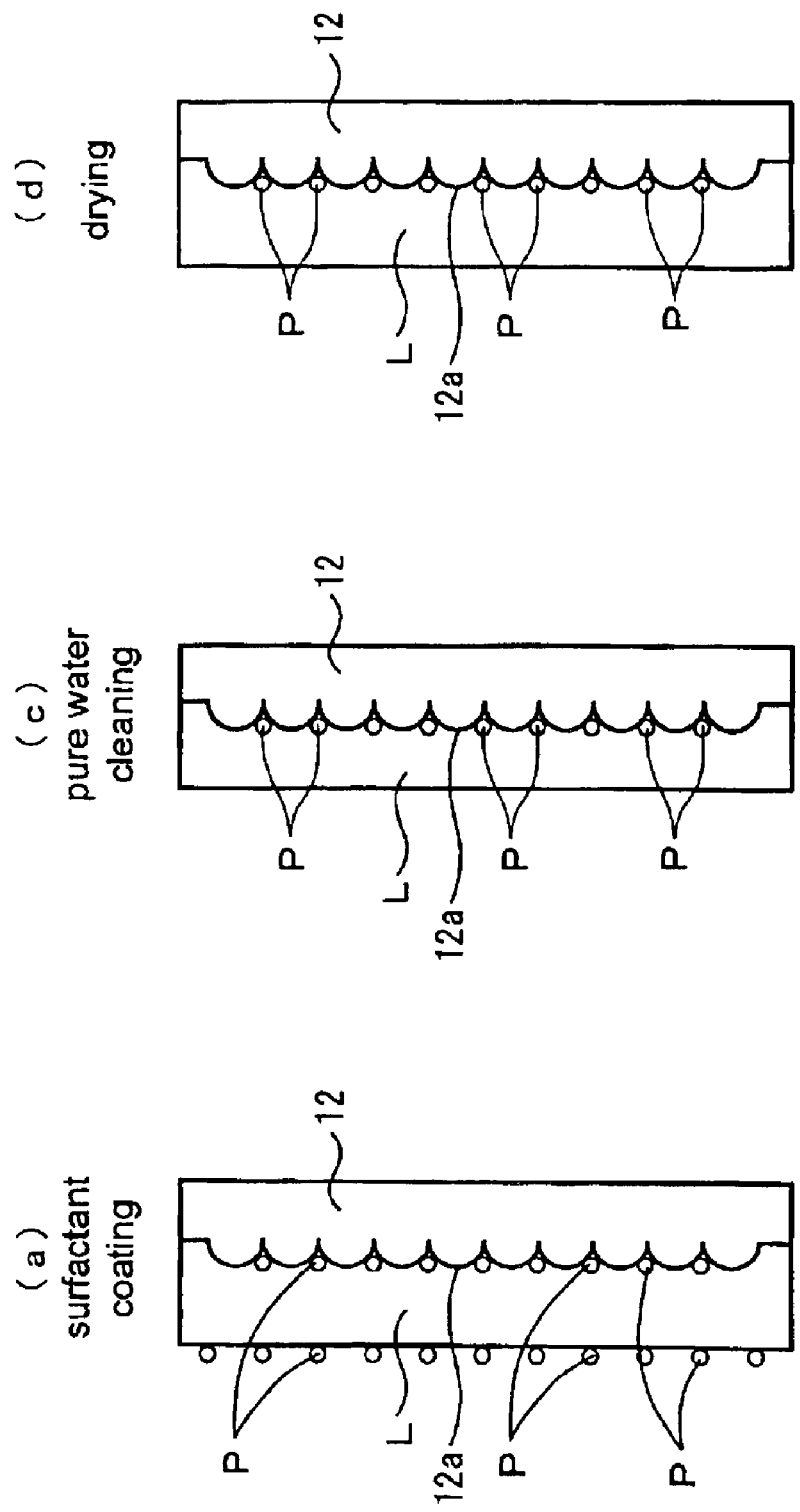
FIG. 4 is a schematic view showing states in order of steps each of a synthetic resin surface of a wafer storage case and particles thereon applied with the second aspect of a process for preventing dust generation of a wafer storage case of the present invention.

FIG. 3 is a flow chart showing steps of a second aspect of a process for preventing dust generation of a wafer storage case of the present invention, and FIG. 4 is a schematic view showing states in order of steps each of a synthetic resin surface of a wafer storage case and particles thereon applied with the second aspect of a process for preventing dust generation of a wafer storage case of the present invention.

The second aspect of a process for preventing dust generation of a wafer storage case of the present invention, as shown in FIG. 3, is performed according to a procedure of surfactant coating (a)→pure water cleaning (c)→drying (for example, clean oven drying) (d), that is, a procedure similar to that of the first aspect of a process for preventing dust generation of a wafer storage case of the present invention shown in FIG. 1 with the exception that the drying (b) after the surfactant coating is omitted. In the second aspect, the surfactant coating is performed in a way similar to FIGS. 1(a) and 2(a) of the first aspect of a process for preventing dust generation of a wafer storage case of the present invention (FIGS. 3(a) and 4(a)).

Then, the synthetic resin surface 12a after the surfactant coating is cleaned with pure water (FIG. 3(c)). By the pure water cleaning, there are washed away particles P attached on a surface of the surfactant layer L. At this time, while the surfactant of the surfactant layer L is concurrently washed away, it is required to perform the cleaning so as to maintain a state where the surfactant layer L covers all of the synthetic resin surface 12a. If the surfactant layer L is partly lost, effective prevention of dust generation cannot be carried out as described above because a bare portion of the synthetic resin surface 12a is exposed, therefore it is necessary to perform; pure water cleaning with care not to cause partial loss of the surfactant layer L.

The surfactant layer L, which is an object for pure water cleaning, is not subjected to the drying, unlike the case of the first aspect shown in FIGS. 1(b) and 2(b); therefore, the surfactant layer L is washed away with ease. For this reason, there is a risk of partial loss of the surfactant layer L when pure water cleaning is performed in a way similar to the pure water cleaning of the dried surfactant layer L (FIGS. 1(c) and 2(c)).

If particles P attached on a surface of the surfactant layer L can be washed away without drying, there arises an advantage in that one drying step can be omitted to realize simplification of the process and furthermore, uniformity of the surfactant layer L can be concurrently achieved. So the inventor has continued a study on pure water cleaning and found that when cleaning is performed with pure water having a low specific resistance, partial separation of the surfactant layer L is suppressed to attain a surfactant layer L in a more uniform state.

Therefore, as pure water used in the pure water cleaning step (FIG. 3(a)), pure water having a low specific resistance, for example, 10 MΩ·cm or less is preferably used. Note that a specific resistance of ordinary pure water is on the order of 16 to 18 MΩ·cm. By dissolving carbon dioxide gas into the ordinary pure water, a specific resistance can be reduced to 10 MΩ·cm or less and pure water including dissolved carbon dioxide gas is preferably used. When carbon dioxide gas is employed in such a manner, a specific resistance of pure water can be reduced while preventing contamination of metal, organic material and others, which would become problematic together with particles.

Finally, the wafer storage case 12 after the pure water cleaning is dried (for example, by clean oven drying) in a way similar to FIGS. 1(d) and 2(d) of the first aspect (FIGS. 3(d) and 4(d)). In the second aspect shown in FIG. 4(d), since particles P present on the synthetic resin surface 12a are blocked and suppressed by the surfactant layer L, dust generation can effectively prevented like the case of the first aspect.

While in the embodiments of FIGS. 1 to 4, description is given of the cases where a new wafer storage case 12 is used, it is needless to say that a method of the present invention can be applied to a case where a used wafer storage case 12 is reused. First, description will be given of the case where the first aspect (FIG. 1) of a process of the present invention is applied on the basis of FIGS. 5 and 6.

Figure 5:
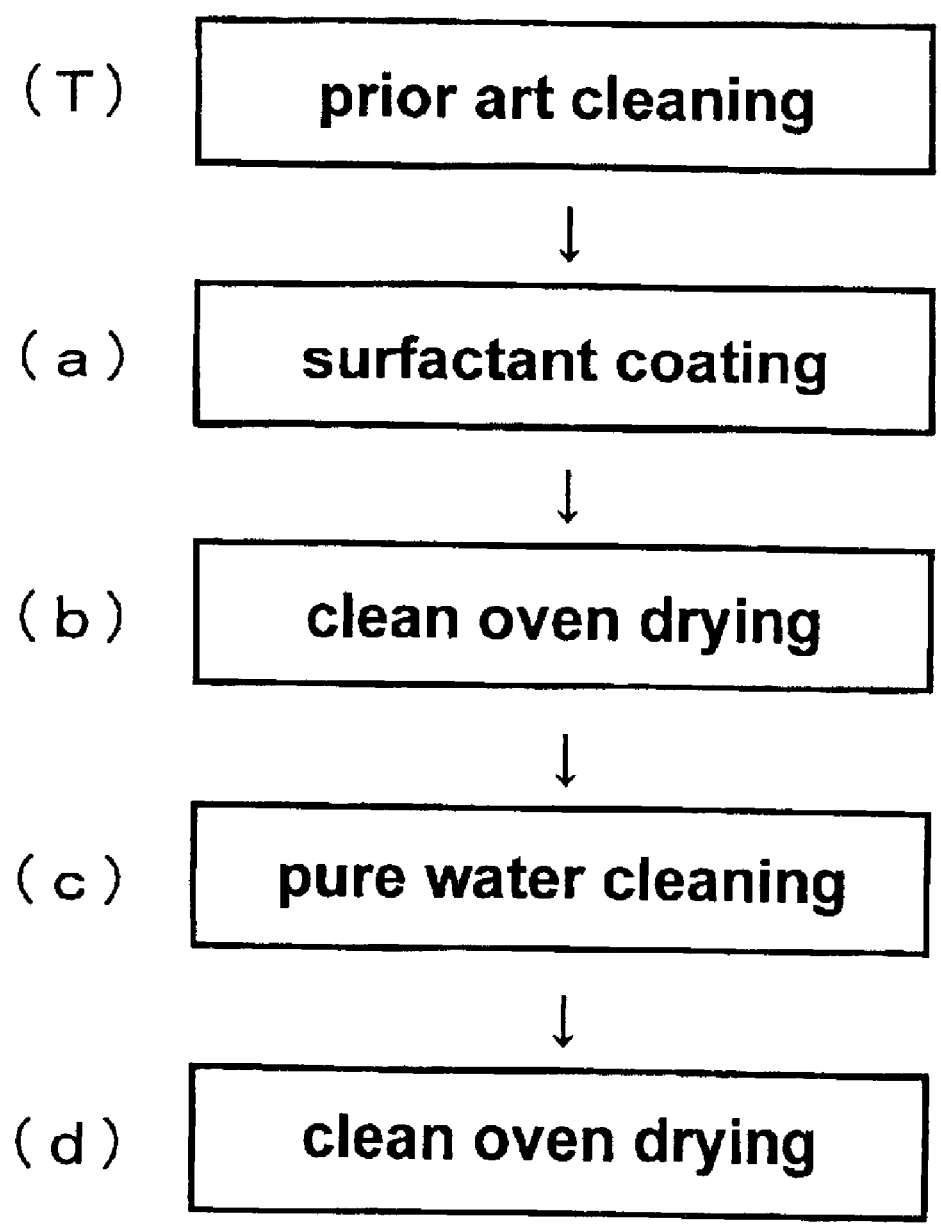
FIG. 5 is a first flow chart showing steps in the case where the first aspect of a process for preventing dust generation of a wafer storage case of the present invention is applied to a reused wafer storage case.

Since the used wafer storage case 12 is usually contaminated, the wafer storage case 12, as shown in FIG. 5, is first subjected to cleaning (T) and thereafter, the following procedure is performed: that is, surfactant coating (a)→drying (b)→pure water cleaning (c)→drying (d). As cleaning of the wafer storage case 12, the known cleaning processes may be applied. For example, there can be named ultrasonic cleaning, shower cleaning, brush cleaning and others. As cleaning liquid, in addition to pure water there can be used surfactant, organic solvent, acid and others.

Figure 6:
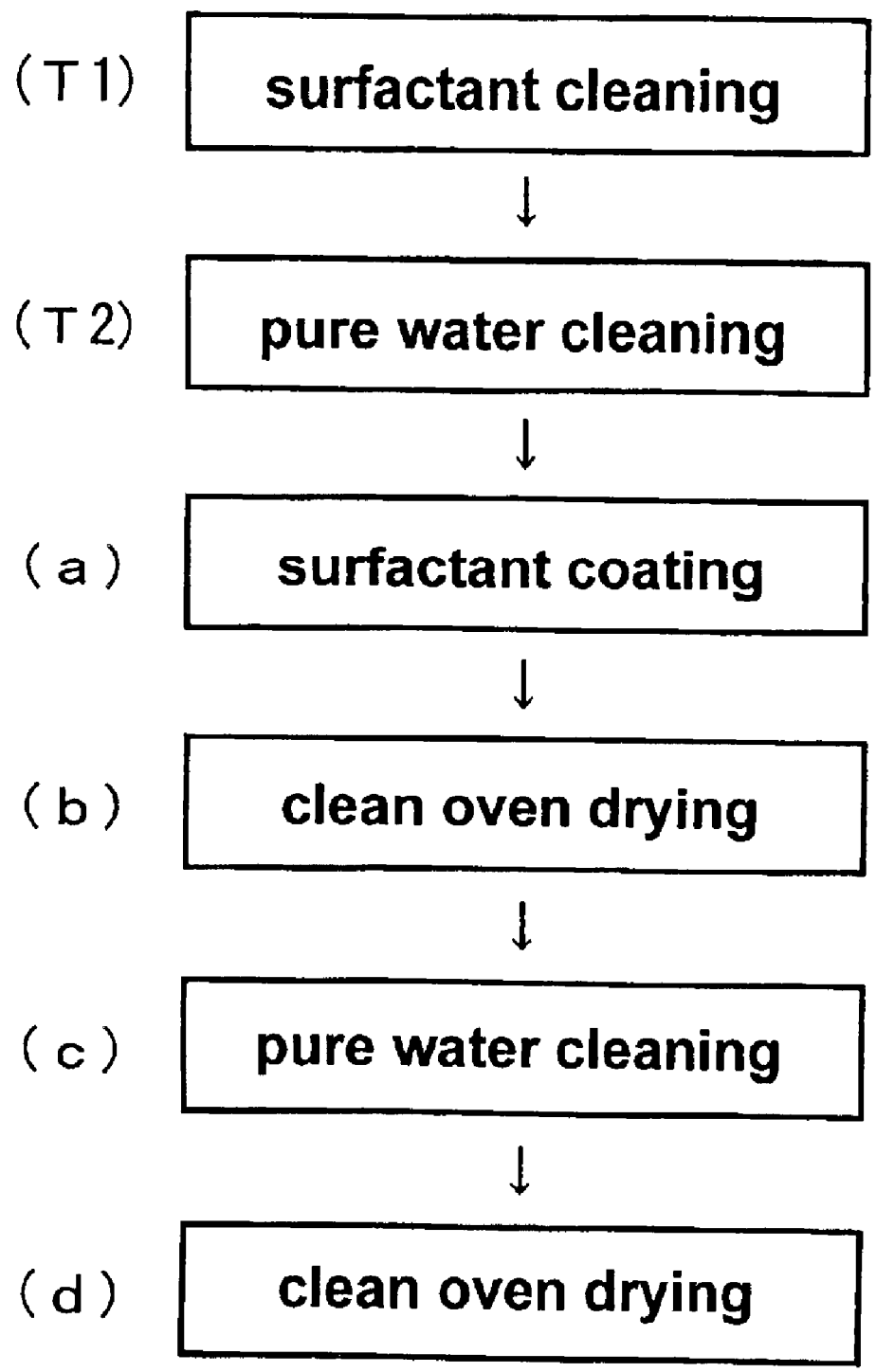
FIG. 6 is a second flow chart showing steps in the case where the first aspect of a process for preventing dust generation of a wafer storage case of the present invention is applied to a reused wafer storage case.

An especially preferable cleaning, as shown in FIG. 6, is a combination of surfactant cleaning (T1)→pure water cleaning (T2)→and it is preferable to thereafter perform a procedure of surfactant coating (a)→drying (b)→pure water cleaning (c)→drying (d).

Figure 7:
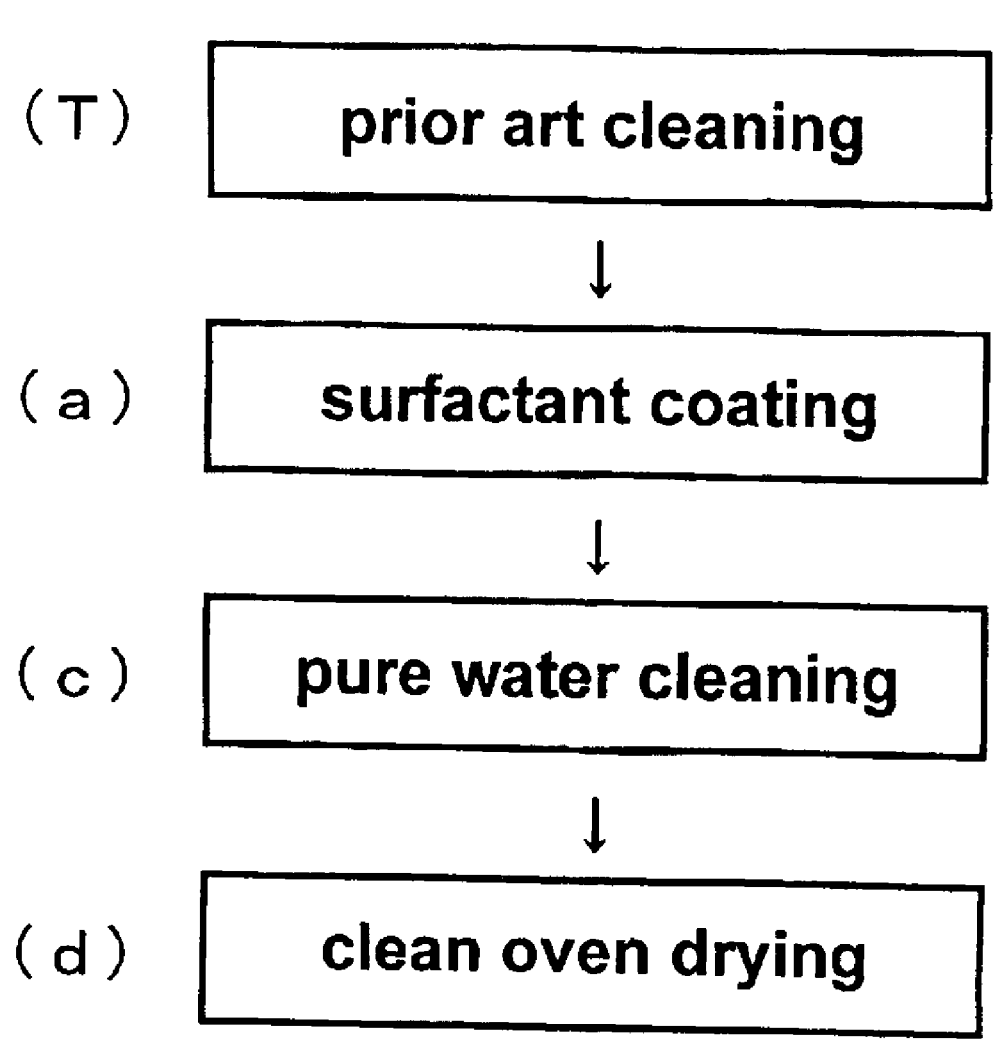
FIG. 7 is a first flow chart showing steps in the case where the second aspect of a process for preventing dust generation of a wafer storage case of the present invention is applied to a reused wafer storage case.
Figure 8:
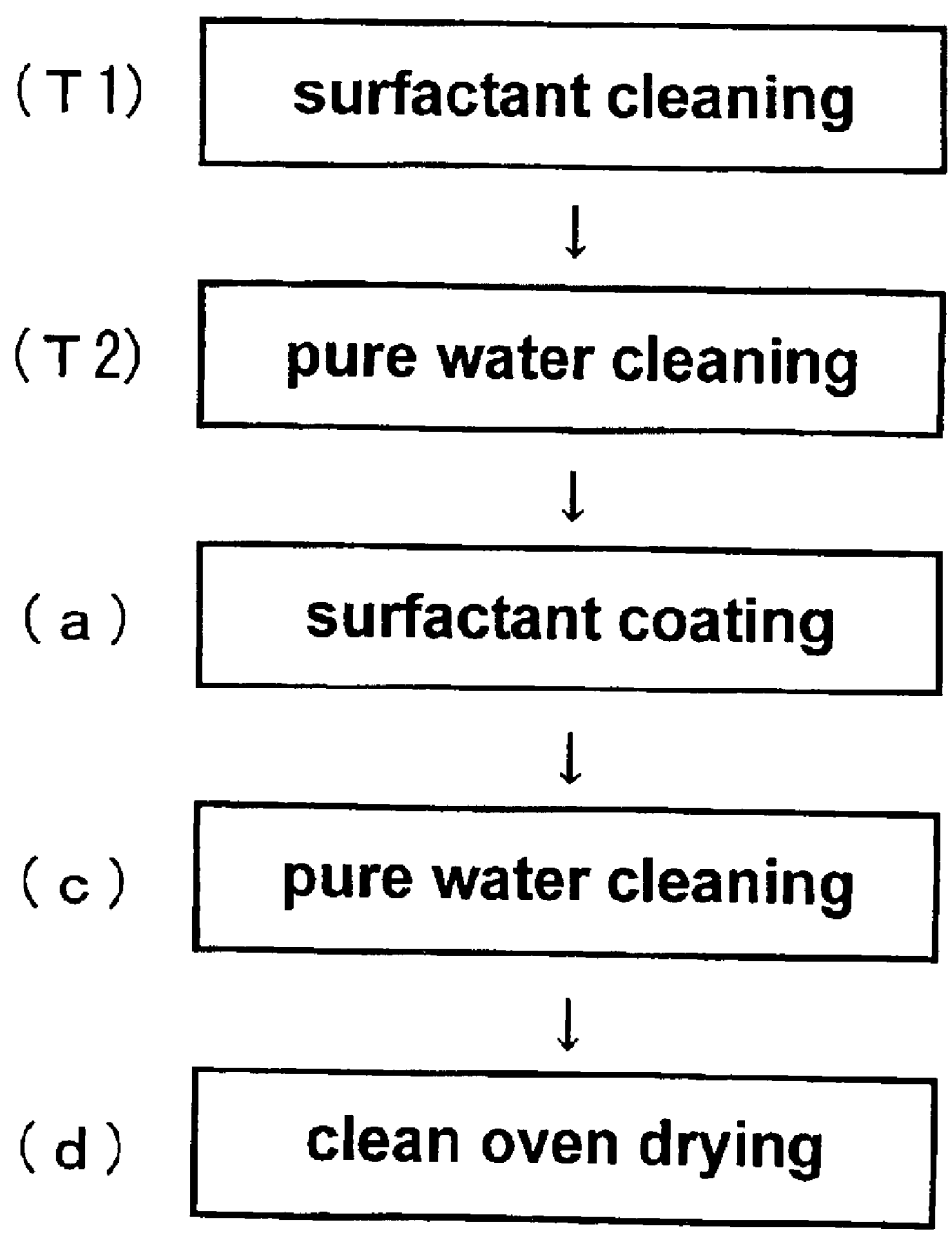
FIG. 8 is a second flow chart showing steps in the case where the second aspect of a process for preventing dust generation of a wafer storage case of the present invention is applied to a reused wafer storage case.

Furthermore, FIGS. 7 and 8 show the case where the second aspect (FIG. 3) of a process of the present invention is applied to a used wafer storage case 12. In this case as well, after the pretreatment cleaning shown in FIGS. 5 and 6 is performed, the process of FIG. 3 is applied. Needless to say, in FIGS. 7 and 8 as well, pure water with a low specific resistance (10 MΩ·cm or less) is preferably used in pure water cleaning (FIGS. 7(c) and 8(c)) after the surfactant coating.

Figure 9:
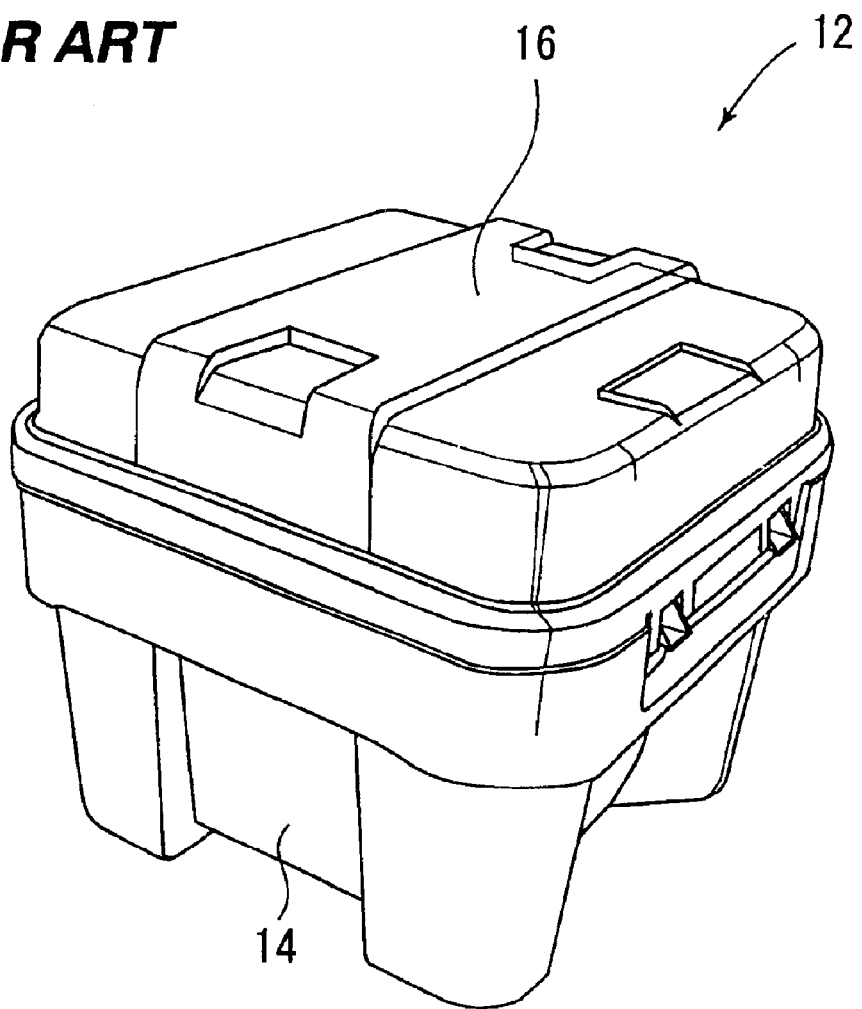
FIG. 9 is a perspective view showing an embodiment of a wafer storage case.
Figure 10:
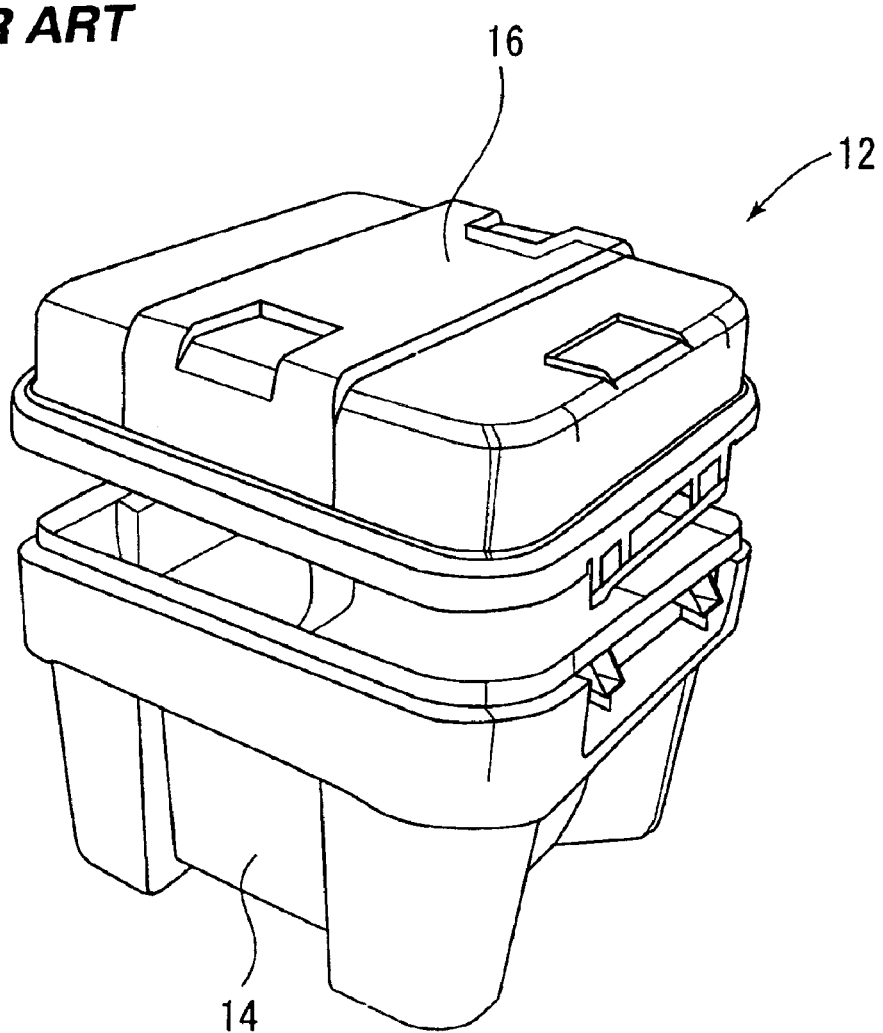
FIG. 10 is a perspective view showing a state where a lid of the wafer storage case of FIG. 9 is opened upward.
Figure 11:
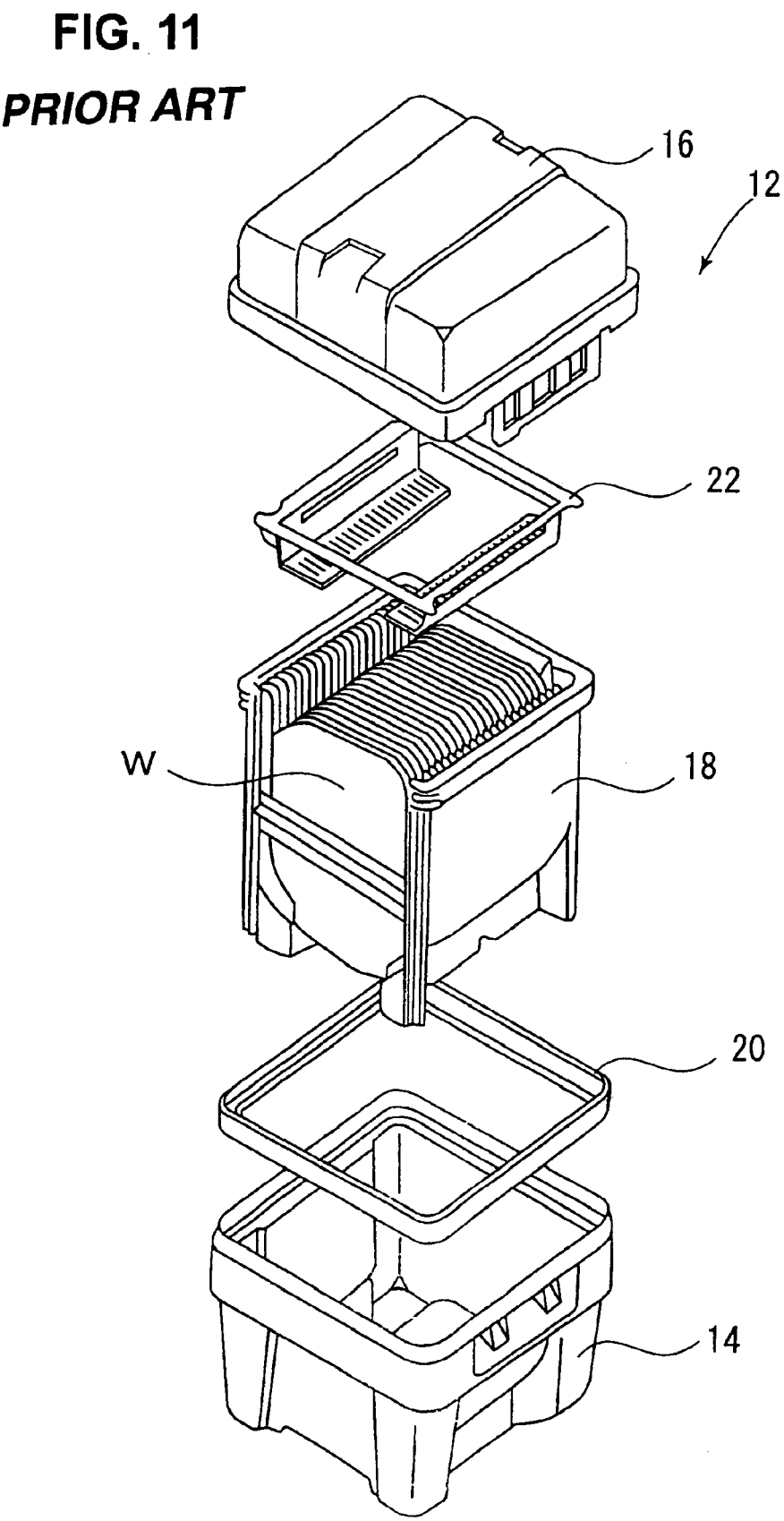
FIG. 11 is an exploded perspective view of the wafer storage case of FIG. 9.

The first aspect of a wafer storing method of the present invention comprises the steps of cleaning wafers such as semiconductor wafers including silicon, gallium arsenide or the like and substrates including quartz glass substrates, optical discs or the like; and thereafter housing the wafers in a wafer storage case 12 of synthetic resin, as shown in FIGS. 9 to 11, surfaces of which are coated with a coating layer of a coating agent such as a surfactant to thereby prevent dust generation from the surfaces thereof.

A second aspect of a wafer storing method of the present invention comprises the steps of cleaning wafers; and thereafter housing the wafers in a wafer storage case 12 treated according to the first aspect (FIGS. 1, 2, 5 and 6) or the second aspect (FIGS. 3, 4, 7 and 8) of a process for preventing dust generation of a wafer storage case of the present invention.

Wafers housed in a wafer storage case 12 of the present invention are stored or transported in a state in which the wafers are housed. In the case where wafers are stored or transported in the wafer storage case 12, it is preferable that, for example, the wafer storage case 12 is wrapped in a bag (not shown) made of a laminate film of polypropylene and polyethylene, further wrapped in a bag (not shown) of a laminate film of aluminum and polypropylene and the wafer storage case thus wrapped is packed in a polypropylene box (not shown).

EXAMPLES

Description will be given of the present invention taking up examples thereof and it is needless to say that the examples are intended to be shown by way of illustration but not to be construed by way of limitation.

(Example 1)

The following treatment was performed on a wafer storage case with a case body and a lid both made of polypropylene similar to ones shown in FIGS. 9 to 11. The wafer storage case was immersed in a 0.1% aqueous solution of a surfactant with HLB (Hydrophile-Lipophile Balance) ranging from 8.8 to 10.0 (SCOUROL, a trade name of nonionic surfactant made by Kao Corp.) for 1 to 2 sec., thereafter the wafer storage case was pulled up from the surfactant aqueous solution. The wafer storage case in a state where the surfactant aqueous solution was coated over all of the surface thereof was dried using a clean oven (made by AIRTECH JAPAN, Ltd.) at 50° C. for 50 min. to form a surfactant layer over all of the surface of the wafer storage case. Then the wafer storage case on which the surfactant layer was formed was cleaned with pure water for 30 sec. and subsequently the wafer storage case was again dried using the clean oven (made by AIRTECH JAPAN, Ltd.) at 50° C. for 50 min.

Evaluation was performed on particles in the wafer storage case of the present invention coated with the surfactant layer according to the following method and results thereof are shown in Table 1. It was found that the number of particles was reduced by a great margin compared with Comparative Example 1 described below. Since the number of particles inside the storage case is small, it is understood that attachment of particles to wafers is also restricted greatly.

<Particle Evaluation Method>

3000 cc of pure water is put into a wafer storage case and the wafer storage case is shaken for 2 min. and thereafter, left as it is for 20 min. Particles in the pure water contained in the wafer storage case are measured using a liquid-phase particle counter (made by Rion Co., Ltd.).

(Example 2)

A wafer storage case was coated with a surfactant in a way similar to Example 1 with the exception that the wafer storage case in a state in which the case was coated with a surfactant aqueous solution was cleaned with pure water (a specific resistance of about 8 MΩ·cm) for 30 sec. without drying, then subjected to steps of pure water cleaning→drying and thereafter, particle evaluation was performed on the wafer storage case. Results thereof are shown in Table 1. It was found that particles in the liquid phase are reduced in number in a way similar to the results of Example 1.

In a way similar to Examples 1 and 2, coating was applied to various wafer storage cases: a wafer storage case having a polycarbonate case body and polycarbonate lid, a wafer storage case having a polycarbonate case body and a polypropylene lid and a wafer storage case having a polypropylene case body and a polycarbonate lid. Evaluation was performed on particles in the various wafer storage cases, and as a result, it was confirmed that the number of particles inside the wafer storage cases were small as in Examples 1 and 2 and attachment of particles to wafers was greatly suppressed.

Comparative Example 1

Wafer storage cases similar to Example 1 were subjected to a prior art cleaning process as described below. The wafer storage cases were subjected to brush cleaning using a 0.3% aqueous solution of a surfactant (SCOUROL, a trade name of nonionic surfactant made by Kao Corp.) for 5 sec., thereafter cleaned with pure water (a specific resistance of 16 to 18 MΩ·cm) for 6 sec. and subsequently dried using the clean oven (made by AIRTECH JAPAN, Ltd.) at 50° C. for 50 min.

In a way similar to Example 1, evaluation was performed on particles in liquid phase in the wafer storage cases cleaned by the prior art and results are shown in Table 1. It was found that the number of particles in this comparative example was increases greatly compared with Example 1.

TABLE 1

| | Particles in liquid | | |
|---|---|---|---|
| | 0.2 μm ≤ particles/cc | 0.3 μm ≤ particles/cc | 0.5 μm ≤ particles/cc |
| Example 1 | 66 | 21 | 3 |
| Example 2 | 55 | 18 | 4 |
| Comparative Example 1 | 476 | 108 | 31 |

(Examples 3, 4 and Comparative Example 2)

25 silicon wafers of 200 mm in diameter were housed in each of wafer storage cases subjected to a surfactant coating or cleaning in a process similar to Examples 1 and 2 and Comparative Example 1, each of which wafers had been measured about the number of particles on a surface thereof using a particle measuring apparatus of a light scattering type. The wafer storage cases were each wrapped with a bag made of a laminate film of polypropylene and polyethylene, and further wrapped with a bag made of a laminate film of aluminum and polypropylene. The wrapped wafer storage cases were each packed in a polypropylene box with a propylene cushioning material and a transportation test was performed on the wafer storage cases transported by means of a truck and an airplane. The transportation was performed such that in a forward run, a truck was used over a route from Shirakawa of Fukushima-ken to Tokyo, an airplane was used over a route from Tokyo to Osaka, and a truck was used on a route within Osaka city, and in a backward run, a transportation was performed over the same routes in the reverse direction from within Osaka city to Shirakawa of Fukushima-ken. Transportation by trucks was performed over routes between Shirakawa and Tokyo and between Osaka Airport and within Osaka City totaling 400 km in distance and transportation by airplanes was performed over a route totaling about 900 km in distance.

The wafers after the transportation were taken out from the wafer storage cases and the number of particles on a surface of each wafer was measured with the particle measuring apparatus of a light scattering type to compare the data with the data prior to the transportation. Results are shown in Table 2.

TABLE 2

| | Increase in the number of particles on wafer surface | | | | | |
|---|---|---|---|---|---|---|
| | 0.2 μm ≤ particles/cc | | 0.3 μm ≤ particles/cc | | 0.5 μm ≤ particles/cc | |
| | average of 25 wafers | maximum | average of 25 wafers | maximum | average of 25 wafers | maximum |
| Example 3 | 3.6 | 12 | 2.5 | 5 | 0 | 0 |
| Example 4 | 2.9 | 9 | 1.8 | 6 | 0 | 0 |
| Comparative Example 2 | 8.2 | 30 | 6.9 | 15 | 1.3 | 7 |

While in Examples 3 and 4, increase in the number of particles on each wafer surface after the transportation was small, in Comparative Example 2 there were some wafers on the surfaces of which increase in the number of particles was great.

Capability of Exploitation in Industry

As described above, the present invention can achieve a great effect capable of effectively preventing dust generation by blocking or suppressing free movement of particles constantly generated from a surface of a synthetic resin wafer storage case with a coating layer of a surfactant.

What is claimed is:

1. A process for preventing dust generation of a wafer storage case comprising the steps of:

coating a surface of the wafer storage case of synthetic resin housing wafers with a coating agent;

drying the wafer storage case coated with the coating agent to cause a coating layer of the coating agent to be firmly adsorbed or attached to the synthetic resin surface;

cleaning the dried wafer storage case and removing particles on a surface of a coating layer using pure water such that the coating layer of the coating agent remains across the surface of the wafer storage case; and drying the cleaned wafer storage case, wherein dust generation from the surface of the wafer storage case is prevented by the coating layer of the coating agent.

2. The process for preventing dust generation of a wafer storage case according to claim 1, wherein the pure water used in the step of cleaning with the pure water such that the coating layer of the coating agent remains across the surface of the wafer storage case is pure water with a low specific resistance.

3. The process for preventing dust generation of a wafer storage case according to claim 2, wherein the pure water with a low specific resistance has a specific resistance of 10 MΩ·cm or less.

4. The process for preventing dust generation of a wafer storage case according to claim 1, 2, or 3, wherein by immersing the wafer storage case in an aqueous solution of a coating agent, the surface of the wafer storage case is coated with the coating agent.

5. The process for preventing dust generation of a wafer storage case according to claim 1, 2, or 3, wherein the wafer storage case to be coated with the coating agent is a cleaned wafer storage case.

6. The process for preventing dust generation of a wafer storage case according to claim 5, wherein the cleaned wafer storage case is a wafer storage case cleaned with surfactant cleaning and pure water cleaning.

7. The process for preventing dust generation of a wafer storage case according to claim 1, 2, or 3, wherein the coating agent is a surfactant.

8. A wafer storing method comprising the steps of:

preparing wafers; and housing the wafers in a wafer storage case treated by a process for preventing dust generation of a wafer storage case according to claim 1, 2, or 3.

* * * * *